US006463558B1

(12) United States Patent
Kuroki

(10) Patent No.: US 6,463,558 B1
(45) Date of Patent: Oct. 8, 2002

(54) SEMICONDUCTOR MEMORY DEVICE

(75) Inventor: Osamu Kuroki, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/301,543

(22) Filed: Apr. 29, 1999

(30) Foreign Application Priority Data

Aug. 26, 1998 (JP) ............................................ 10-240553

(51) Int. Cl.⁷ .......................... G01R 31/28; G11C 29/00

(52) U.S. Cl. ...................................... 714/724; 714/718

(58) Field of Search ................................ 714/724, 718, 714/738, 744, 743, 32, 42; 365/189.01, 189.02, 201; 370/241, 242

(56) References Cited

U.S. PATENT DOCUMENTS

| 4,835,774 A | * | 5/1989 | Ooshima et al. ............... 371/25 |
| 5,483,493 A | * | 1/1996 | Shin ............................. 365/201 |
| 5,491,697 A | * | 2/1996 | Tremel et al. ................ 371/5.1 |
| 5,673,270 A | * | 9/1997 | Tsujimoto ................... 371/21.2 |

* cited by examiner

Primary Examiner—Christine T. Tu
(74) Attorney, Agent, or Firm—Volentine Francos, PLLC

(57) ABSTRACT

A semiconductor memory device includes a memory circuit which stores data, a control circuit which outputs a data and a control signal to control the memory circuit and which receives a data stored in the memory circuit, and a selector circuit which selectively transfers either one of the data output from the control circuit or external data output from an external device to the memory circuit in response to a selection signal. The memory circuit, the control circuit, and the selector circuit in the semiconductor memory device are formed on a single chip.

10 Claims, 6 Drawing Sheets

FIG. 5

| RAMZ | DOE | DOUT | NODE1 | NODE2 | NODE3 | NODE4 | DOUT1 | DOUT2 |
|------|-----|------|-------|-------|-------|-------|-------|-------|
| H | H | L | H | H | H | L | L | Hiz |
| H | H | H | L | L | H | L | H | Hiz |
| L | H | L | H | L | H | H | Hiz | L |
| L | H | H | H | L | L | L | Hiz | H |

SEMICONDUCTOR MEMORY DEVICE

BACKGROUND OF THE INVENTION

1. Field of the Invention

The present invention generally relates to a semiconductor memory device, and more particularly, to a semiconductor memory device having both a Random Access Memory part and a Logic part therein.

This application is a counterpart of Japanese patent applications, Serial Number 240553/1998, filed Aug. 26, 1998, the subject matter of which is incorporated herein by reference.

2. Description of the Related Art

A Dynamic Random Access Memory (hereinafter DRAM), which is operated in response to a control signal, needs a controller which outputs the control signal to DRAM and a control circuit (hereinafter LOGIC part) comprised of a Micro Processor Unit (MPU) for controlling the controller. A semiconductor device having both a DRAM and the LOGIC part is called an LRAM.

FIG. 6 is a block diagram showing a conventional LRAM. The conventional LRAM will be explained hereinafter with reference to FIG. 6.

LRAM 300 is made up of the LOGIC part 310 which serves as a control circuit and a RAM part 320 which functions as a memory. The RAM part 320 is controlled by a clock signal CLK and an address signal ADD which are output from the LOGIC part 310. The RAM part 320 directly outputs an output data us signal DOUT to the LOGIC part 310. The RAM part 320 also directly receives an input data signal DIN from the LOGIC part 310.

The LOGIC part 310 is mainly made up of MPU 311, a memory part 312 which is comprised of Read Only Memory (ROM) or Static Random Access Memory (SRAM) or the like, and a controller 313 for controlling the RAM part 320.

The MPU 311, which is controlled by a LOGIC part control signal CTR, controls data reading/writing from and to the memory part 312 and also controls the controller 313. Furthermore, the controller 313 outputs the clock signal CLK the address signal ADD and the data input signal DIN to the RAM part 320.

The RAM part 320 includes a timing generator 321 which receives the clock signal CLK, a row/column address buffer 322 which receives the address signal ADD, an input/output buffer 323 which receives the input data signal DIN, and a memory cell array 324. The RAM part 320 further includes a row decoder 325 which decodes the address signal ADD and outputs a row address signal to the memory cell array 324, a column decoder 326 which decodes the address signal ADD and outputs a column address signal to the memory cell array 324, and a sense amplifier 327. The output data signal DOUT is output from the input/output buffer 323 to the controller 313 in the LOGIC part 310.

In the conventional LRAM 300, using the LOGIC part 310 is the only way to access to the RAM part 320. Accordingly, a test circuit or the like for testing the RAM part 320 must be included in the LOGIC part 310 in order to test the RAM part 320.

Furthermore, since the RAM part 320 is initialized under the control of the LOGIC part 310, an operation time of the LRAM 300 becomes long.

Consequently, there has been a need for an improved semiconductor memory device.

SUMMARY OF THE INVENTION

It is an object of the present invention is to provide a semiconductor memory device that may easily input a test pattern from an external device.

It is another object of the present invention is to provide a semiconductor memory device that may initialize a RAM part rapidly.

It is another object of the present invention is to provide a semiconductor memory device that may directly test only a RAM part.

It is another object of the present invention is to provide a semiconductor memory device that may directly read/write an initial data to a RAM part.

According to one aspect of the present invention, for achieving one or more of the above objects, there is provided a semiconductor memory device for receiving an external data from an external device. The semiconductor memory device includes a memory circuit which stores data, a control circuit which outputs a data and a control signal to control the memory circuit and which receives a data stored in the memory circuit, and a selector circuit which selectively transfers either one of the data output from the control circuit or the data from the external circuit to the memory circuit in response to a selection signal. The memory circuit, the control circuit, and the selector circuit in the semiconductor memory device are formed on a single chip.

The above and further objects and novel features of the invention will more fully appear from the following detailed description, appended claims and the accompanying drawings.

BRIEF DESCRIPTION OF THE DRAWINGS

FIG. 5 is a truth table showing an operation of an output selector 240.

DETAILED DESCRIPTION OF THE PREFERRED EMBODIMENTS

First Embodiment

Figure 1:
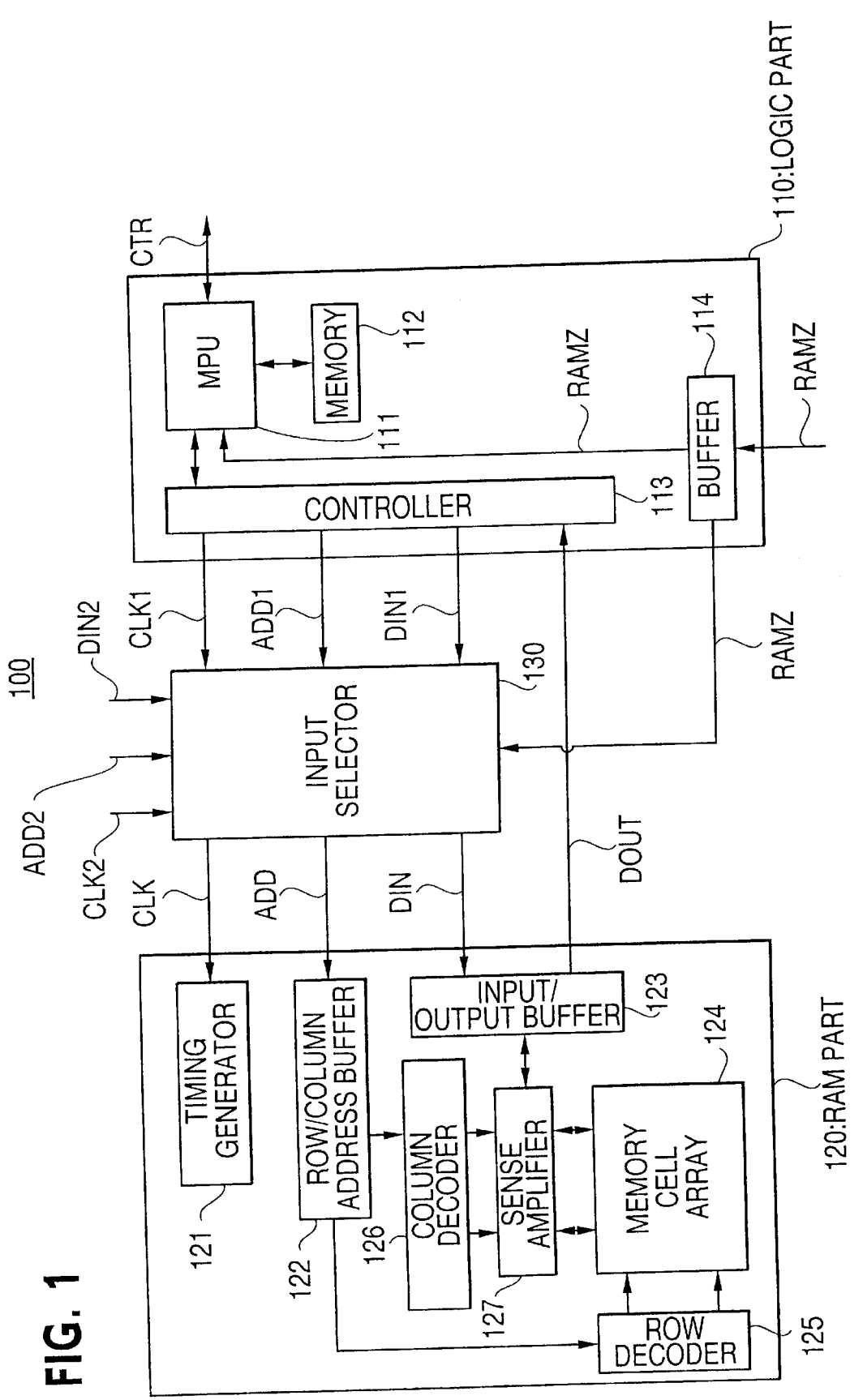
FIG. 1 is a block diagram showing a semiconductor memory device according to a first preferred embodiment.

A semiconductor memory device according to the present invention will be explained hereinafter with reference to the figures. In order to simplify explanations, wherein like elements are given like or corresponding reference numerals through this specification and figures.

FIG. 1 is a block diagram showing a semiconductor memory device according to the present invention.

The LRAM 100 s made up of a LOGIC part 110 which serves as a control circuit, a RAM part 120 which functions as a memory, and an input selector 130 provided between the LOGIC part 110 and the RAM part 120. The LOGIC part 110, RAM part 120 and the input selector 130 are formed on a single semiconductor chip.

The RAM part 120 is controlled by a clock signal CLK1 and an address signal ADD1 which are output from the LOGIC part 110 or is controlled by a clock signal CLK2 and an address signal ADD2 which are output from an external device. (The external device is a circuit or the like which is located outside of the chip.) The RAM part 120 directly outputs an output data signal DOUT to the LOGIC part 110.

The RAM part 320 receives an input data signal DIN1 output from the LOGIC part 110 or an input data signal DIN2 output from the external device.

The LOGIC part 110 is mainly made up of MPU 311, a memory part 112 which is comprised of Read Only Memory (ROM) or Static Random Access Memory (SRAM) or the like, a controller 113 for controlling the RAM part 120, and a buffer 114.

The MPU 111, which is controlled by a LOGIC part control signal CTR, controls data reading/writing from and to the memory part 112 and also controls the controller 113. Furthermore, the controller 113 outputs the clock signal CLK1, the address signal ADD1 and the data input signal DIN1 to the input selector 130.

The buffer 114 receives a selection signal RAMZ and outputs the selection signal RAMZ to the MPU 111 and the input selector 130.

The RAM part 120 includes a timing generator 121 which receives the clock signal CLK, a row/column address buffer 122 which receives the address signal ADD, an input/output buffer 123 which receives the input data signal DIN, and a memory cell array 124. The RAM part 120 further includes a row decoder 125 which decodes the address signal ADD and outputs a row address signal to the memory cell array 124, a column decoder 126 which decodes the address signal ADD and outputs a column address signal to the memory cell array 124, and a sense amplifier 127. The output data signal DOUT is output from the input/output buffer 123 to the controller 113 in the LOGIC part 110. The structure of the RAM part 120 is well known as a conventional DRAM.

The input selector 130 selects the clock signals CLK1, CLK2, the address signals ADD1, ADD2, and the data signals DIN1, DIN2 and transmits thus selected signals to the RAM part 120 in response to the selection signal RAMZ.

Figure 2:
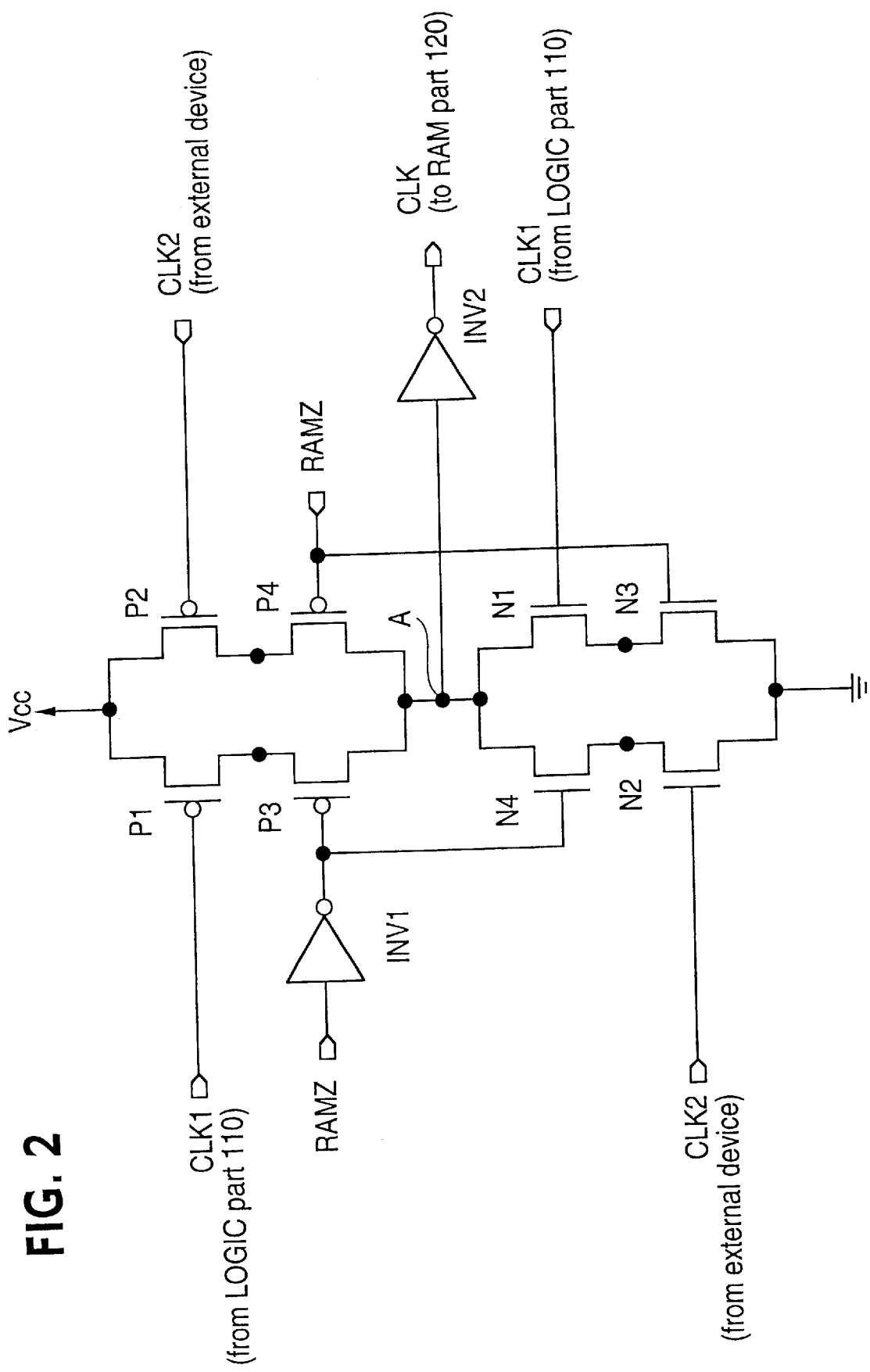
FIG. 2 is a circuit diagram showing an input selector 130.

FIG. 2 is a circuit diagram showing an embodiment of the input selector 130.

In FIG. 2, only the input selector 130 with respect to the clock signal will be explained hereinafter. However, the structures of respective input selectors 130 with respect to the address signal and the input data signal are the same. Therefore, the explanations regarding these structures will be omitted hereinafter. That is, in the case where the selector 130 is with respect to the address signal, the references CLK1, CLK2 and CLK are replaced with ADD1, ADD2 and ADD. In the case where the selector 130 is with respect to the input data signal, the references CLK1, CLK2 and CLK are replaced with DIN1, DIN2 and DIN.

The input selector 130 is comprised of P channel MOS transistors (hereinafter PMOS) P1 through P4, N channel MOS transistors (hereinafter NMOS) N1 through N 4, and inverters INV1 through INV2 as shown in FIG. 2.

The PMOS P1 has a source electrode connected to a voltage source VCC, a drain electrode, and a gate electrode which receives the clock signal CLK1 output from the LOGIC part 110. The PMOS P2 has a source electrode connected to the voltage source VCC, a drain electrode, and a gate electrode which receives the clock signal CLK2 transferred from the external device. The PMOS P3 has a source electrode connected to the drain electrode of the PMOS P1, a drain electrode connected to a node A, and a gate electrode which receives an output signal of the inverter INV1. The PMOS P4 has a source electrode connected to the drain strode of the PMOS P2, a drain electrode connected to the node A, and a gate electrode which receives the selection signal RAMZ.

The NMOS N1 has a drain electrode connected to the node A, a source electrode, and a gate electrode which receives the clock signal CLK1 output from LOGIC part 110. The NMOS N4 has a drain electrode connected to the node A, a source electrode, and a gate electrode which receives the output signal of the inverter INV1. The NMOS N3 has a drain electrode connected to the drain electrode of the NMOS N1, a source electrode connected to a ground, and a gate electrode which receives the selection signal RAMZ. The NMOS N2 has a drain electrode connected to the drain electrode of the NMOS N4, a source electrode connected to the ground, and a gate electrode which receives the clock signal CLK2 output from the external device.

The inverter INV1 has an input terminal receiving the selection signal RAMZ and an output terminal outputting an inverted selection signal RAMZ to the PMOS P3 and NMOS N4. The inverter INV2 has an input terminal connected to the node A and outputs the clock signal CLK to the RAM part 120.

Next, an operation of the first preferred embodiment will be explained hereinafter.

(Case 1: The Selection Signal RAMZ=L)

When the selection signal RAMZ having an L level, the NMOS N3 and the PMOS P3 are the Off state. Thus, a current path, which is comprised of the PMOS P1 and the PMOS P3, is invalid. A current path, which is comprised of the NMOS N1 and the NMOS N3, is also invalid. Accordingly, even if the clock signal CLK1 is applied to the input selector 130, the level of this signal is not transferred to the RAM part 120.

On the other hand, a current path, which is comprised of the PMOS P2 and the PMOS P4, is valid. A current path, which is comprised of the NMOS N2 and the NMOS N4, is also valid. Consequently, the level of the clock signal CLK2 is transferred to the RAM part 120 as the clock signal CK That is, when the external device outputs the clock signal CLK2 having the H level to the LRAM 100, the NMOS N2 enters an ON state and the PMOS P2 enters an OFF state. Now, since both of the NMOS N2 and NMOS N4 are the ON state and the PMOS P2 is the OFF state, the node A is electrically connected to the ground. Therefore, the inverter INV2 outputs the clock signal CLK having the H level to the RAM part 120. The operations of the input selectors 130 with respect to the address signal ADD2 and the input data signal DIN are the same as that of the input selector 130 explained above.

When the external device outputs the clock signal CLK2 having the L level to the LRAM 100, the NMOS N2 enters the OFF state and the PMOS P2 enters the ON state Now, since both of the PMOS P2 and PMOS. P4 are the ON state and the NMOS N2 is the OFF state, the node A is electrically connected to the VCC. Therefore, the inverter INV2 outputs the clock signal CLK having the L level to the RAM part 120. The operations of the input selectors 130 with respect to the address signal ADD2 and the input data signal DIN are the same as that of the input selector 130 explained above.

As a result, the RAM part 120 is controlled according to these signals output from the external circuit.

For example, a test data pattern or an initial data (DIN), which are prepared in the external circuit, may be written into predetermined memory locations in the memory cell array 124 synchronized with the clock signal CLK having a clock speed determined by the external circuit. This operation may be executed independent of the LOGIC part 110.

(Case 2: The Selection Signal RAMZ=H)

When the selection signal RAMZ has an H level, the NMOS N4 and the PMOS P4 are the OFF state. Thus, the current path, which is comprised of the PMOS P2 and the PMOS P4, is invalid. The current path, which is comprised of the NMOS N2 and the NMOS N4, is also invalid. Accordingly, even if the clock signal CLK2 is applied to the input selector 130, the level of this signal is not transferred to the RAM part 120.

On the other hand, the current path, which is comprised of the PMOS P1 and the PMOS P3, is valid. The current path, which is comprised of the NMOS N1 and the NMOS N3, is also valid. Consequently, the level of the clock signal CLK1 is transferred to the RAM part 120 as the clock signal CLK That is, when the external device outputs the clock signal CLK1 having the H level to the LRAM 100, the NMOS N1 enters the ON state and the PMOS P1 enters the OFF state. Now, since both of the NMOS N1 and the NMOS N3 are the ON state and the PMOS P1 is the OFF state, the node A is electrically connected to the ground. Therefore, the inverter INV2 outputs the clock signal CLK having the H level to the RAM part 120. The operations of the input selectors 130 with respect to the address signal ADD2 and the input data signal DIN are the same as that of the input selector 130 explained above.

When the external device outputs the clock signal CLK1 having the L level to the LRAM 100, the NMOS N1 enters the OFF state and the PMOS P1 enters the ON state. Now, since both of the PMOS P1 and PMOS P3 are the ON state and the NMOS N1 is the OFF state, the node A is electrically connected to the VCC. Therefore, the inverter INV2 outputs the clock signal CLK having the L level to the RAM part 120. The operations of the input selectors 130 with respect to the address signal ADD2 and the input data signal DIN are the same as that of the input selector 130 explained above.

As a result, the RAM part 120 is controlled according to these signals output from the LOGIC part 110.

In this first preferred embodiment, since the LRAM 100 may select either the signals from the external device or the signals from the LOGIC part 110 by changing the voltage level of the selection signal RAMZ, the data which is prepared in the external device may be directly inputted into the RAM part 120, in addition to inputting the data in the LOGIC part 110 to the RAM part 120. Therefore, it is much easier to input the test data pattern to the RAM part 120. Furthermore, the initial data may be written rapidly to the RAM part 120.

Second Embodiment

A semiconductor memory circuit according to the second preferred embodiment will be explained hereinafter with reference to figures.

Figure 3:
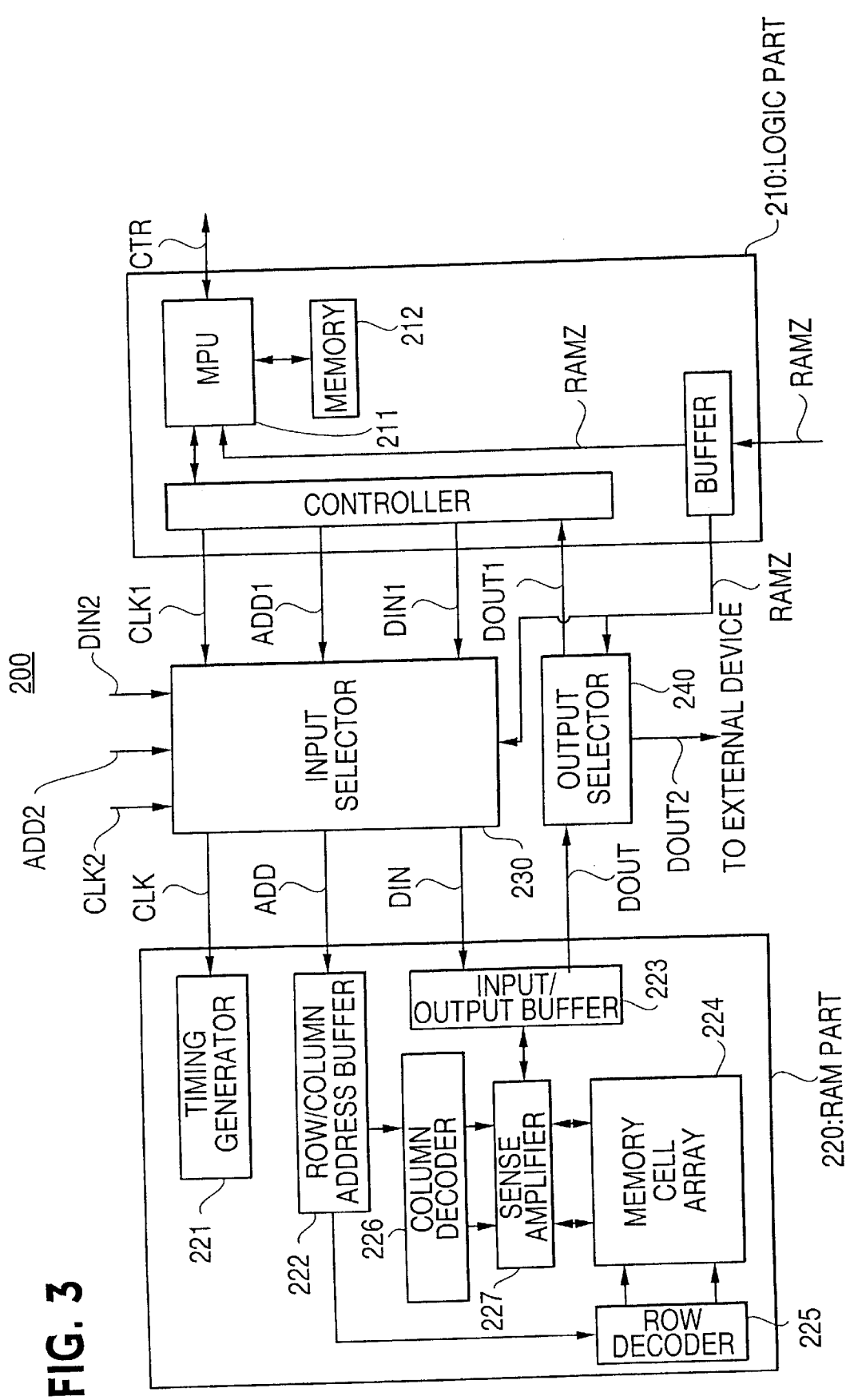
FIG. 3 is a block diagram showing a semiconductor memory device according to a second preferred embodiment.

FIG. 3 is a block diagram showing a semiconductor memory device according to the second preferred embodiment.

As shown in FIG. 3, a LRAM 200 includes a LOGIC part 210 which serves as a control circuit, a RAM part 220 which functions as a memory, and an input selector 230. These elements respectively correspond to the LOGIC part 110, the RAM part 120, and the input selector 130 as shown in FIG. 1. Accordingly, the explanations of these elements are omitted hereinafter.

The LRAM 200 further includes an output selector 240 connected between the LOGIC part 210 and the RAM part 220. The selector 240 inputs the output data signal DOUT output from the RAM part 220 and outputs the same to the LOGIC part 110 as an output data signal DOUT 1 or the external circuit as an output data signal DOUT 2 in response to the selection signal RAMZ.

Figure 4:
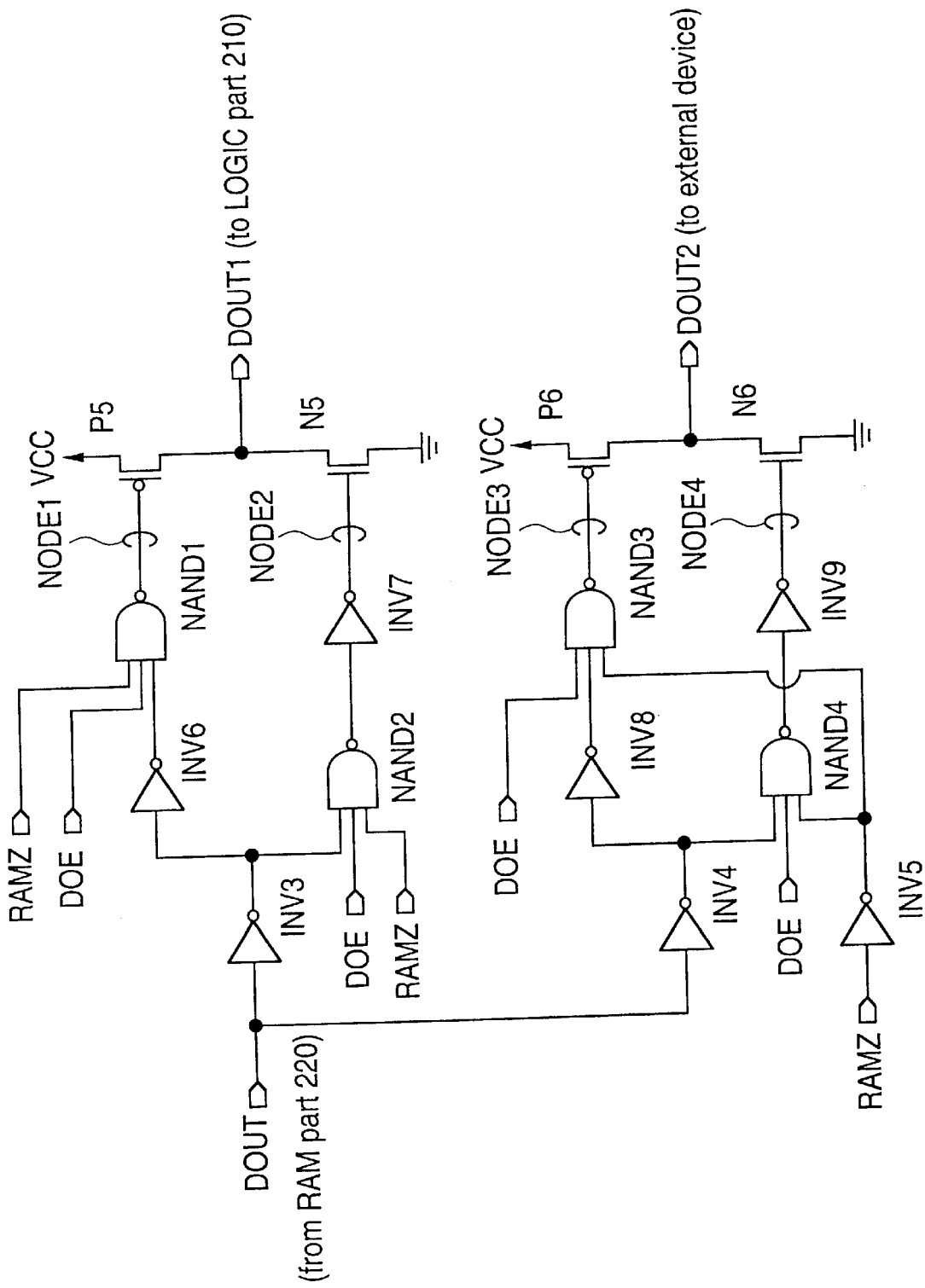
FIG. 4 is a circuit diagram showing an output selector 240.
Figure 6:
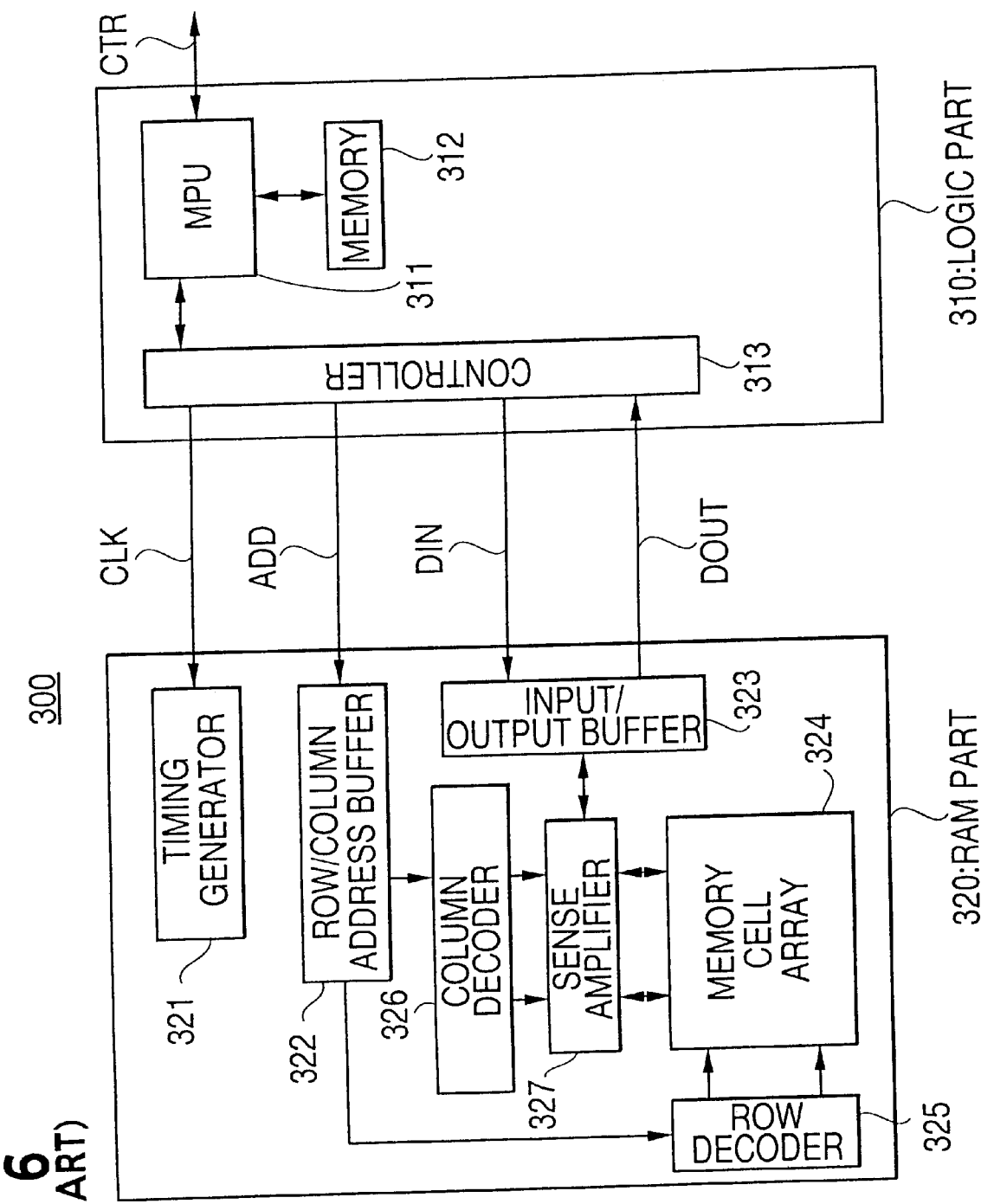
FIG. 6 is a block diagram showing a conventional LRAM.

FIG. 4 is a circuit diagram showing the output selector 240.

The output selector 240 is made up of PMOS P5, P6, NMOS N5, N6, inverters INV3 trough INV9, and NAND circuit (hereinafter NAND) NAND 1 through NAND 4.

The PMOS P5 and the NMOS N5 comprise an output buffer which outputs the output data signal DOUT1 to the LOGIC part 10. The PMOS P6 and the NMOS N6 comprise an output buffer which outputs the output data signal DOUT2 to the external circuit The NAND1, NAND2, and the inverters INV3, INV6, INV7 comprise an output buffer control circuit to control the output buffer (PMOS P5 and NMOS N5) in response to the selection signal RAMZ and a data output enable signal DOE. The NAND3, NAND4, and the inverters INV4, INV5, INV8, INV9 comprise an output buffer control circuit to control the output buffer (PMOS P6 and NMOS N6) in response to the selection signal RAMZ and the data output enable signal DOE.

The PMOS P5 has a source electrode connected to the voltage source VCC, a drain electrode, and a gate electrode connected an NODE1. The NMOS N5 has a source electrode connected to the ground, a drain electrode connected to the drain electrode of the PMOS P5 and a gate electrode connected an NODE2. The NAND1 has a first input terminal receiving the selection signal RAMZ, a second input terminal receiving the data output enable signal DOE, a third input terminal connected to the inverter INV6, and an output terminal connected to the NODE1. The inverter INV7 has an input terminal and an output terminal connected to the NODE2. The inverter INV6 has an input terminal and an output terminal connected to the third input terminal of the NAND1. The NAND2 has a first input terminal connected to the input terminal of the inverter INV6, a second input terminal receiving the data output enable signal DOE, a third input terminal receiving the selection signal RAMZ, and an output terminal connected to the input terminal of the inverter INV7. The inverter INV3 has an input terminal receiving the data output signal DOUT output from the RAM part 220 and an output terminal connected to the input terminal of the inverter INV6 and the first input terminal of the NAND2.

The PMOS P6 has a source electrode connected to the voltage source VCC, a drain electrode, ad a gate electrode connected an NODE3. The NMOS N6 has a source electrode connected to the ground, a drain electrode connected to the drain electrode of the PMOS P6 and a gate electrode connected an NODE4. The NAND3 has a first input terminal receiving the data output enable signal DOE, a second input terminal, a third input terminal, and an output terminal connected to the NODE3. The inverter INV9 has an input terminal and an output terminal connected to the NODE4. The inverter INV8 has an input terminal and an output terminal connected to the second input terminal of the NAND3. The NAND4 has a first input terminal connected to the input terminal of the inverter INV8, a second input terminal receiving the data output enable signal DOE, a third input terminal connected to the third input terminal of the NAND3, and an output terminal connected to the input terminal of the inverter INV9. The inverter INV4 has an input terminal receiving the data output signal DOUT output from the RAM part 220 and an output terminal connected to the input terminal of the inverter INV8 and the first input terminal of the NAND4. The inverter INV5 has an input terminal receiving the selection signal RAMZ and an output terminal connected to the third input terminal of the NAND4.

Next, an operation of the second preferred embodiment will be explained hereinafter with reference to FIG. 4 and FIG. 5.

FIG. 5 is a truth table showing an operation of the output selector 240.

(Case 1: The Selection Signal RAMZ=H, The Data Output Enable Signal DOE=H)

When the selection signal RAMZ is the H level, the NAND3 and the NAND4 respectively output the H levels regardless of any voltage levels applied to their input terminals. Therefore, the NODE3 become the H level and the NODE4 become the L level and thus both of the PMOS P6 and the NMOS N6 turn OFF. As a result, the output data signal DOUT2 becomes a high impedance state. This means that the output data signal DOUT2 is not output to the external device or the output data signal DOUT is not transferred (or is not output) to the external device.

On the other hand, when the data output signal DOUT is the H level, the NAND1 outputs the L level to the NODE 1. The NAND2 outputs the H level to the inverter INV7 and thus the NODE2 become the L level. Accordingly, the PMOS P5 turns ON and the NMOS N5 turns OFF. As a result, the output data signal DOUT1 becomes the H level. This means that the output data signal DOUT1 having the H level is output to the LOGIC part 210 or the output data signal DOUT having the H level is transferred (or is output) to the LOGIC part 210.

When the data output signal DOUT is the L level, the NAND1 outputs the H level to the NODE1. The NAND2 outputs the L level to the inverter INV,7 and thus the NODE2 become the H level. Accordingly, the PMOS P5 turns OFF and the NMOS N5 turns ON. As a result, the output data signal DOUT1 becomes the L level. This means that the output data signal DOUT1 having the L level is output to the LOGIC part 210 or the output data signal DOUT having the L level is transferred (or is output) to the LOGIC part 210.

(Case 2: The Selection Signal RAMZ=L, The Data Output Enable Signal DOE=H)

When the selection signal RAMZ is the L level, the NAND1 and the NAND2 respectively output the H levels regardless of any voltage levels applied to their input terminals. Therefore, the NODE1 become the H level and the NODE2 become the L level and thus both of the PMOS P5 and the NMOS N5 turn OFF. As a result, the output data signal DOUT1 becomes the high impedance state. This means that the output data signal DOUT1 is not output to the LOGIC part 210 or the output data signal DOUT is not transferred (or is not output) to the LOGIC part 210.

On the other hand, when the data output signal DOUT is the H level, the NAND3 outputs the L level to the NODE3. The NAND4 outputs the H level to the inverter INV9 and thus the NODE4 become the L level. Accordingly, the PMOS P6 turns ON and the NMOS N6 turns OFF. As a result, the output data signal DOUT2 becomes the H level. This means that the output data signal DOUT2 having the H level is output to the external device or the output data signal DOUT having the H level is transferred (or is output) to the external device.

When the data output signal DOUT is the L level, the NAND3 outputs the H level to the NODE2. The NAND4 outputs the L level to the inverter INV9 and thus the NODE4 become the H level. Accordingly, the PMOS P6 turns OFF and the NMOS N6 turns ON. As a result, the output data signal DOUT2 becomes the L level. This means that the output data signal DOUT2 having the L level is output to the external device or the output data signal DOUT having the L level is transferred (or is output) to the external device.

As mentioned above, by setting The Selection Signal RAMZ to the H level, either the PMOS P5 or the NMOS N5 enters the ON state in response to The Data Output Enable Signal DOE and the output data signal DOUT. Therefore, the data output from the RAM part 220 is transferred to the LOGIC part 210. At this time, both of the PMOS P6 and the NMOS N6 enter the OFF states according to The Selection Signal RAMZ. Thus, the data output from the RAM part 220 is not transferred to the external device.

By setting The Selection Signal RAMZ to the L level, either the PMOS P6 or the NMOS N6 enters the ON state in response to the data output enable signal DOE and the output data signal DOUT. Therefore, the data output from the RAM part 220 is transferred to the external device. At this time, both of the PMOS P5 and the NMOS N5 enter the OFF states according to the selection signal RAMZ. Thus, the data output from the RAM part 220 is not transferred to the LOGIC part 210.

In this second preferred embodiment, since the data output from the RAM part 120 may be directly output to the external device by changing the voltage level of The Selection Signal RAMZ, in addition to the operation of the first preferred embodiment, it is possible to test only the RAM part 120 independently.

Furthermore, it is possible to write the initial data into the RAM part 120 rapidly and to read out the data in the RAM part 120 directly.

While the preferred form of the present invention has been described, it is to be understood that modifications will be apparent to those skilled in the art without departing from the spirit of the invention. For example, only one selection signal RAMZ is used for controlling both the input selector and the output selector in the preferred embodiment. However, two or more signals may be used for controlling them.

The scope of the invention, namely, is to be determined solely by the following claims.

What is claimed is:

1. A semiconductor memory device for receiving an external data from an external device, said semiconductor memory device comprising:

a memory circuit which stores data;

a control circuit which outputs a data and a control signal to control said memory circuit and which receives a data stored in said memory circuit; and a selector circuit which selectively transfers either one of the data output from said control circuit or the external data from said external device to said memory circuit in response to a selection signal;

wherein said memory circuit, said control circuit, and said selector circuit are formed on a single chip, and wherein said selector circuit further selectively transfers either one of the control signal from the control circuit or a second control signal to said memory circuit in response to said selection signal, said second control signal being received from said external device.

2. A semiconductor memory device as set forth claim 1, wherein the control signal and the second control signal respectively includes clock signals.

3. A semiconductor memory device as set forth claim 2, wherein said memory circuit comprises a random access memory.

4. A semiconductor memory device as set forth claim 1, wherein the control signal and the second control signal respectively includes address signals.

5. A semiconductor memory device as set forth claim 4, wherein said memory circuit comprises a random access memory.

6. A semiconductor memory device for receiving and outputting external data from and to an external device, the semiconductor memory device comprising:

a memory circuit which stores data;

a control circuit which outputs a data and a control signal to control said memory circuit and which receives a data output from said memory circuit;

an input selector circuit which selectively transfers either one of the data output from said control circuit or the external data from said external device to said memory circuit in response to a first selection signal; and an output selector circuit which selectively transfers the data output from said memory circuit to either one of said control circuit or said external device in response to a second selection signal;

wherein said memory circuit, said control circuit, said input selector circuit, and said output selector circuit are formed on a single chip, and wherein said input selector circuit further selectively transfers either one of the control signal from said control circuit or a second control signal to said memory circuit, said second control signal being received from said external device.

7. A semiconductor memory device as set forth claim 6, wherein the control signal and the second control signal respectively includes clock signals.

8. A semiconductor memory device as set forth claim 7, wherein said memory circuit comprises a random access memory.

9. A semiconductor memory device as set forth claim 6, wherein the control signal and the second control signal respectively includes address signals.

10. A semiconductor memory device as set forth claim 9, wherein said memory circuit comprises a random access memory.

\* \* \* \* \*